(12) United States Patent
Kang et al.

(10) Patent No.: US 9,845,269 B2
(45) Date of Patent: Dec. 19, 2017

(54) MULTI-FUNCTIONAL BN—BN COMPOSITE

(71) Applicants: National Institute of Aerospace Associates, Hampton, VA (US); The United States of America, as represented by the Administrator of the National Aeronautics and Space Administration, Washington, DC (US)

(72) Inventors: Jin Ho Kang, Newport News, VA (US); Robert G. Bryant, Lightfoot, VA (US); Cheol Park, Yorktown, VA (US); Godfrey Sauti, Hampton, VA (US); Luke Gibbons, Williamsburg, VA (US); Sharon Lowther, Hampton, VA (US); Sheila A. Thibeault, Hampton, VA (US); Catharine C. Fay, Yorktown, VA (US)

(73) Assignees: National Institute of Aerospace Associates, Hampton, VA (US); The United States of America as represented by the Administration of NASA, Washington, DC (US)

( * ) Notice: Subject to any disclaimer, the term of this patent is extended or adjusted under 35 U.S.C. 154(b) by 646 days.

(21) Appl. No.: 13/986,089

(22) Filed: Mar. 29, 2013

(65) Prior Publication Data
US 2015/0376069 A1    Dec. 31, 2015

Related U.S. Application Data

(60) Provisional application No. 61/686,107, filed on Mar. 30, 2012.

(51) Int. Cl.
*C04B 35/583*    (2006.01)
*C04B 35/622*    (2006.01)
(Continued)

(52) U.S. Cl.
CPC ............ *C04B 35/583* (2013.01); *B82Y 30/00* (2013.01); *C04B 35/6229* (2013.01);
(Continued)

(58) Field of Classification Search
CPC .. C04B 35/583; C04B 35/6229; C04B 35/806
See application file for complete search history.

(56) References Cited

U.S. PATENT DOCUMENTS 3,673,118 A * 6/1972 Mandorf, Jr. ......... C23C 14/243
                                                                    252/519.3
5,707,471 A * 1/1998 Petrak ................... C04B 35/806
                                                                    156/89.27

(Continued)

OTHER PUBLICATIONS

Katsuda, Y. Reinforcement of precursor-derived Si—(B—)C—N ceramics with carbon nanotubes. Dissertation, Stuttgart, 2005.*
(Continued)

*Primary Examiner* — Erin Snelting
(74) *Attorney, Agent, or Firm* — Kimberly A. Chasteen

(57) ABSTRACT

Multifunctional Boron Nitride nanotube-Boron Nitride (BN—BN) nanocomposites for energy transducers, thermal conductors, anti-penetrator/wear resistance coatings, and radiation hardened materials for harsh environments. An all boron-nitride structured BN—BN composite is synthesized. A boron nitride containing precursor is synthesized, then mixed with boron nitride nanotubes (BNNTs) to produce a composite solution which is used to make green bodies of different forms including, for example, fibers, mats, films, and plates. The green bodies are pyrolized to facilitate transformation into BN—BN composite ceramics. The pyrolysis temperature, pressure, atmosphere and time are controlled to produce a desired BN crystalline structure. The wholly BN structured materials exhibit excellent thermal stability, high thermal conductivity, piezoelectricity as well as enhanced toughness, hardness, and radiation shielding
(Continued)

properties. By substituting with other elements into the original structure of the nanotubes and/or matrix, new nanocomposites (i.e., BCN, BCSiN ceramics) which possess excellent hardness, tailored photonic bandgap and photoluminescence, result.

18 Claims, 5 Drawing Sheets

(51) Int. Cl.
*C04B 35/80* (2006.01)
*H01L 41/43* (2013.01)
*H01L 41/187* (2006.01)
*B82Y 30/00* (2011.01)

(52) U.S. Cl.
CPC .......... *C04B 35/806* (2013.01); *H01L 41/187* (2013.01); *H01L 41/43* (2013.01); *C04B 2235/386* (2013.01); *C04B 2235/3821* (2013.01); *C04B 2235/3826* (2013.01); *C04B 2235/422* (2013.01); *C04B 2235/428* (2013.01); *C04B 2235/46* (2013.01); *C04B 2235/465* (2013.01); *C04B 2235/486* (2013.01); *C04B 2235/5256* (2013.01); *C04B 2235/5284* (2013.01); *C04B 2235/94* (2013.01)

(56) References Cited

U.S. PATENT DOCUMENTS

| | | | | |
|---|---|---|---|---|
| 6,478,994 | B1* | 11/2002 | Sneddon | B01D 67/0067 264/43 |
| 6,774,074 | B2* | 8/2004 | Rousseau | D01F 9/08 423/290 |
| 6,838,162 | B1* | 1/2005 | Gruber | C04B 35/573 428/293.4 |
| 7,229,747 | B2* | 6/2007 | Park | B82Y 30/00 427/385.5 |
| 8,206,674 | B2* | 6/2012 | Smith | B82Y 30/00 204/157.4 |
| 2006/0008676 | A1* | 1/2006 | Ebata | C04B 41/009 428/698 |
| 2009/0117021 | A1* | 5/2009 | Smith | B82Y 30/00 423/290 |

OTHER PUBLICATIONS

Griebel et al. Molecular dynamics simulations of boron-nitride nanotubes embedded in amorphous Si—B—N. INS Preprint No. 0501, 2005.*

* cited by examiner

R = H, C, Phenyl, alkyl, etc

US 9,845,269 B2

MULTI-FUNCTIONAL BN—BN COMPOSITE

CROSS REFERENCE TO RELATED APPLICATION

This Application claims the benefit of U.S. Provisional Application No. 61/686,107 filed on Mar. 30, 2012 for "MULTI-FUNCTIONAL BN—BN COMPOSITE."

STATEMENT REGARDING FEDERALLY SPONSORED RESEARCH OR DEVELOPMENT

The invention described herein was made in the performance of work under a NASA cooperative agreement and by employees of the United States Government and is subject to the provisions of Public Law 96-517 (35 U.S.C. §202) and may be manufactured and used by or for the Government for governmental purposes without the payment of any royalties thereon or therefore. In accordance with 35 U.S.C. §202, the cooperative agreement recipient elected to retain title.

BACKGROUND OF THE INVENTION

1. Field of the Invention

The present invention relates to nanocomposites, and, more particularly to boron nitride nanotube-boron nitride (BN—BN) nanocomposites.

2. Description of Related Art

Aerospace and other industrial applications require high-temperature sensing, actuation, communication and structural elements that are able to withstand extreme environments. For example, the power generation industry requires materials designed to operate under high temperatures, pressures, and, in the cases of nuclear power plants, radiation environments. Another example is the development of materials for high friction environments, such as aircraft brake pads, which require high wear resistance to prolong the lifetime of the material, excellent thermal conductivity to dissipate the heat generated, and high thermal stability in oxidative environments. Sensors, actuators and structural materials able to withstand extreme temperatures, as well as high impact forces, such as with the Space Shuttle leading edges, are desirable for a variety of tailored applications. BN—BN nanocomposite materials are an appropriate choice to replace carbon based nanocomposites for applications when insulating materials are necessary. Furthermore, controlling the amount and type of conductive material nanocomposites, such as the BCN ceramic, can be prepared with tailored electrical conductivity.

State of the art structural materials for high wear/friction conditions include carbon-carbon composites that suffer from oxidation at the high temperatures generated during their operation, as well as asbestos containing liners inclusions that have been shown to be a health risk.

Conventional ferroelectric ceramic powders such as lead zirconate titanates (Perovskite PZT) have been used with a polymer matrix to create flexible piezoelectric polymer composites for sensing and actuation. Their heavy weight, brittleness and toxicity have limited their use in aerospace applications to very low loading levels and their effectiveness as flexible sensors and actuators has been disappointing. Their Curie temperature, where they lose their piezoelectric properties, is only about 200° C. In addition, anti-penetration/wear resistance and radiation shielding materials have been widely required for space exploration but are limited in usefulness due to the previous mentioned restraints. Thus there is a requirement to develop robust materials exhibiting adequately high hardness/toughness and high radiation shielding properties while providing sensing and actuation capabilities at temperatures over 500° C. Such materials have as yet not been developed.

Recently, a series of amorphous piezoelectric polyimides containing polar functional groups have been developed, through molecular design and computational chemistry, for potential use as sensors in high temperature applications. The piezoelectric response of these polyimides is, however, an order of magnitude smaller than that of poly(vinylidene fluoride) (PVDF). This is due to the fact that the dipoles in the polymer do not align along the applied electric field efficiently because of limited chain mobility within the imidized closed ring structure. To increase the piezoelectric response of these polymers, synthesis with various monomers, control of the poling process, and addition of carbon nanotubes (CNTs) or boron nitride nanotubes (BNNTs) into polymer have been reported [Kang et al, Nano, 1, 77 (2006); Park et al, Adv Mater, 20, 2074 (2008)].

A new method of preparing BN film or fiber using a boron-nitrogen containing polymeric precursor was developed [Rousseau et al., U.S. Pat. No. 6,774,074]. Rousseau teaches the synthesis of a boron-nitrogen containing polymer to make a green body according to Wagner's work [Wagner et al, Inorganic Chemistry, 1, 99, (1962)], then obtaining a BN ceramic fiber or film by pyrolysis of the green body. The BN ceramic obtained exhibited high modulus and hardness.

There are still limitations to the use of electroactive polyimide composites in many applications. For example, polymer based materials have the limitation of service temperatures well below 500° C. Also, the pyrolyzed BN materials taught by Wagner et al. exhibit excellent thermal stability but, like other ceramic materials, still possess very poor toughness. Carbon based, high hardness/toughness materials for high friction and structural applications suffer from degradation in oxidizing atmospheres.

It is a primary aim of the present invention to provide boron nitride nanotube-boron nitride (BN—BN) nanocomposites.

It is an object of the invention to provide BN—BN nanocomposites having enhanced toughness.

It is an object of the invention to provide BN—BN nanocomposites having enhanced hardness.

It is an object of the invention to provide BN—BN nanocomposites having enhanced radiation shielding properties.

It is an object of the invention to provide BN—BN nanocomposites having tailored photonic bandgap.

It is a further object of the invention to provide BN—BN nanocomposites having enhanced photoluminescence.

Finally, it is an object of the present invention to accomplish the foregoing objectives in a simple and cost effective manner.

The above and further objects, details and advantages of the invention will become apparent from the following detailed description, when read in conjunction with the accompanying drawings.

SUMMARY OF THE INVENTION

The present invention addresses these needs by providing a method for forming boron nitride nanotube-boron nitride (BN—BN) nanocomposites. In this method, a boron nitride containing ceramic precursor is synthesized and then combined with a boron nitride nanotube solution to form a composite precursor to form at least one green body from the composite precursor. The formed green body is then pyrolized into BN—BN composite ceramics. The at least one green body is preferably pyrolized at a temperature of at least 800° C. and more preferably at a temperature of at least 1500° C. Further, the at least one green body is preferably pyrolized under ammonia or an inert gas under a vacuum and under pressure, preferably above 5 MPa and less than 10 GPa and more preferably above 10 Pa and less than 1 kPa. In the preferred embodiment, the at least one green body is fibers, woven mats, non-woven mats, films or plates. In another embodiment of the invention, carbon, silicon, a combination of silicon and carbon or a combination of boron nitride, boron carbide, and silicon carbide is added to the boron nitride containing ceramic precursor. In this method, the concentration of boron nitride nanotube solution in the composite precursor is between 0.01 and 99.9% by weight. Boron nitride nanotube-boron nitride (BN—BN) nanocomposites prepared according this method are also described.

BRIEF DESCRIPTION OF THE DRAWINGS

A more complete description of the subject matter of the present invention and the advantages thereof, can be achieved by reference to the following detailed description by which reference is made to the accompanying drawings in which.

DETAILED DESCRIPTION OF THE PREFERRED EMBODIMENT

Figure 1A:
FIG. 1a shows the chemical structure of a BN inorganic polymer precursor.

The following detailed description is of the best presently contemplated mode of carrying out the invention. This description is not to be taken in a limiting sense, but is made merely for the purpose of illustrating general principles of embodiments of the invention. The embodiments of the invention and the various features and advantageous details thereof are more fully explained with reference to the non-limiting embodiments and examples that are described and/or illustrated in the accompanying drawings and set forth in the following description. It should be noted that the features illustrated in the drawings are not necessarily drawn to scale, and the features of one embodiment may be employed with the other embodiments as the skilled artisan recognizes, even if not explicitly stated herein. Descriptions of well-known components and techniques may be omitted to avoid obscuring the invention. The examples used herein are intended merely to facilitate an understanding of ways in which the invention may be practiced and to further enable those skilled in the art to practice the invention. Accordingly, the examples and embodiments set forth herein should not be construed as limiting the scope of the invention, which is defined by the appended claims. Moreover, it is noted that like reference numerals represent similar parts throughout the several views of the drawings.

Recently, a new and conceptually simple method of producing extraordinarily long, highly crystalline BNNTs was demonstrated. M. W. Smith et al., U.S. Patent Application Pub 2009/0117021, M. W. Smith et al, *Nanotechnology*, 20, 505604 (2009), Continuation-In-Part application Ser. No. 12/322,591 filed Feb. 4, 2009 for Apparatus for the Production of Boron Nitride Nanotubes and Continuation-In-Part application Ser. No. 12/387,703 filed May 6, 2009 for Boron Nitride Nanotube Fibrils and Yarns, all of which are incorporated herein by reference in their entireties, describe such materials. Co-pending U.S. patent application Ser. No. 13/068,329 filed May 9, 2011, entitled "Neutron and Ultraviolet Shielding Films Fabricated Using Boron Nitride Nanotubes and Boron Nitride Nanotube Polymer Composites", describing the manufacture of radiation shielding films fabricated using boron nitride nanotubes and boron nitride nanotube polymer composites, and Co-pending U.S. patent application Ser. No. 12/925,047 filed Oct. 13, 2010, entitled "Energy Conversion Materials Fabricated with Boron Nitride Nanotubes (BNNTs) and BNNT Polymer composites", describing actuators and sensors fabricated with boron nitride nanotubes (BNNTs) and BNNT polymer composites, are also incorporated herein by reference in their entireties.

Generally, the present invention relates to the development of multifunctional boron nitride nanotube-boron nitride (BN—BN) nanocomposites for energy transducers, thermal conductors, anti-penetrator/wear resistance coatings, and radiation hardened materials for use in harsh environments. For this purpose, an all boron-nitride structured BN—BN composite is synthesized. First, a boron nitride containing precursor is synthesized, then mixed with boron nitride nanotubes (BNNTs) to produce a composite solution. Carbon or silicon or a combination of the two can be added to the matrix precursor. The composite solution is used to make green bodies of different forms including, but not limited to, fibers, woven or non-woven mats, films, and plates. The green bodies are pyrolized to facilitate transformation into BN—BN composite ceramics. The pyrolysis temperature, pressure, atmosphere and time are controlled to produce a desired BN crystalline structure. The wholly BN structured materials exhibit excellent thermal stability, high thermal conductivity, piezoelectricity as well as enhanced toughness, hardness, and radiation shielding properties. By substituting with other elements, such as carbon or silicon into the original structure of the nanotubes and/or matrix, new nanocomposites such as BCN or BCSiN ceramics which possess excellent hardness, tailored photonic bandgap and photoluminescence, can be prepared.

BN—BN materials with high temperature stability, excellent thermal conductivity, radiation hardening, anti-penetrant/wear resistance as well as sensing and actuating capabilities are expected to be used in a range of industrial applications. These include sensors and structural elements in the power generation industry, including nuclear power plants where turbomachinery runs under heavy mechanical stresses and at elevated temperatures, potentially in high radiation environments. The high toughness BN—BN composites can conceivably be used as robust control rods (neutron moderators) for nuclear reactors. Processing plants, where smelters and kilns are run at high temperatures in potentially hostile atmospheres and in which traditional BN has been used for liners, can also benefit from the toughened composites described in this invention, making for more robust and safer plants.

High friction components, such as brake pads, where large quantities of heat are produced and which often fail due to oxidation before wear are another application where the high thermal stability, oxidation resistance, toughness/wear resistance and thermal conductivity of the BN—BN composites would be a distinct advantage.

Yet another field of application is in the aerospace industry, where high temperature sensors and actuators are required for monitoring system health in engines as well as other subsystems. The high thermal stability and toughness of the BN—BN composites as well as light weight (due to the low atomic mass of the constituent elements) also suggests applications as structural elements in supersonic and hypersonic vehicles.

High temperature sensors and actuators also have potential use in the automobile industry where higher engine temperatures and better controlled fuel/air mixtures are being pursued in order to increase efficiency.

The highly stable, energy harvesting and sensing materials described in the present invention can facilitate self-sustaining remote sensors for use in harsh environments, such as applications associated with producing nuclear power or monitoring volcanic activity.

The robust, radiation hardening composites described herein can be used for protecting circuitry in high temperature/radiation environments such as those experienced by high altitude aircraft, nuclear material sensors and spacecraft such as MESSENGER in orbit around Mercury.

The present technology is aimed at making materials with extremely high thermal stability, high thermal conductivity, piezoelectricity, excellent anti-penetrant/wear resistance and radiation hardening capabilities. These properties are expected from the unique molecular structure and morphology of the wholly boron-nitrogen system. The B—N bonds are very stable, contributing to the high thermal stability. BN and BNNTs possess high thermal conductivity due to efficient phonon transport. The high neutron absorption cross sections, as well as the low atomic masses of the elements making up the BN—BN system, result in radiation hardening materials with no fragmentation from high energy radiation. The infusion of BNNTs into a BN matrix gives excellent toughness. It is also expected that the structure of the composite yields enhanced resistance to thermal shock.

Figure 1B:
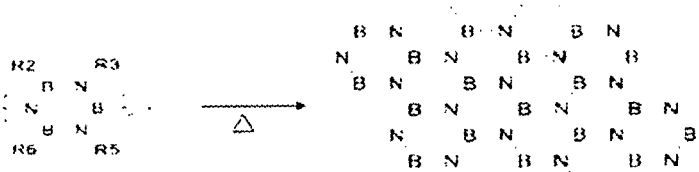
FIG. 1b shows schematic illustration of the conversion of the boron-nitride containing inorganic polymer precursor into one of BN ceramics.
Figure 2A:
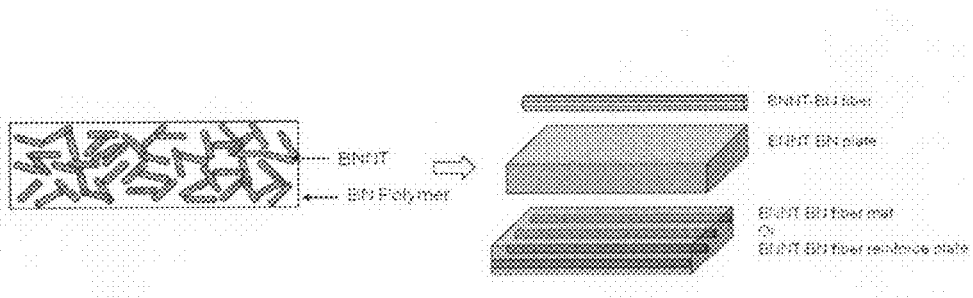
FIG. 2a shows schematic illustration of the fabrication processes of a BNNT—BN inorganic polymer composite and different green body structures (fiber, plate, fiber mat and fiber reinforced composite plate)
Figure 2B:
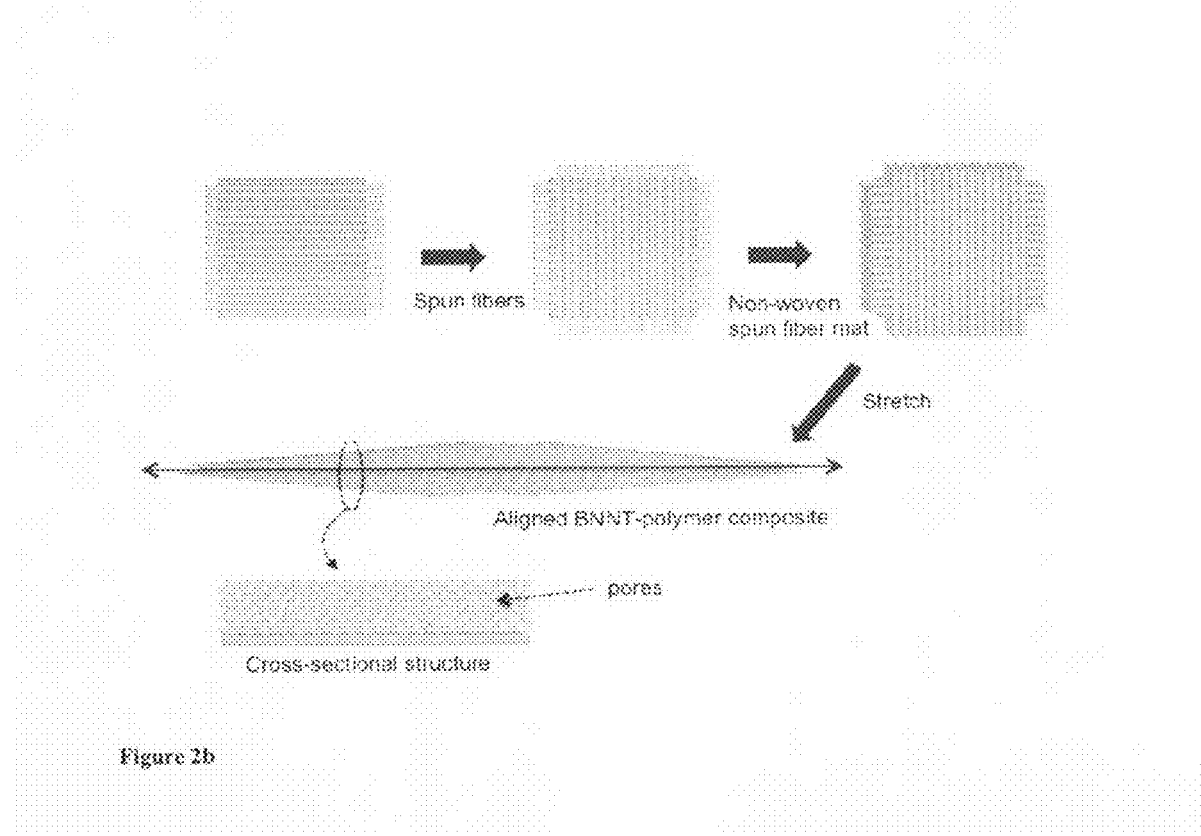
FIG. 2b shows a schematic illustration of the fabrication processes of an aligned BNNT-inorganic polymer non-woven mat.
Figure 3A:
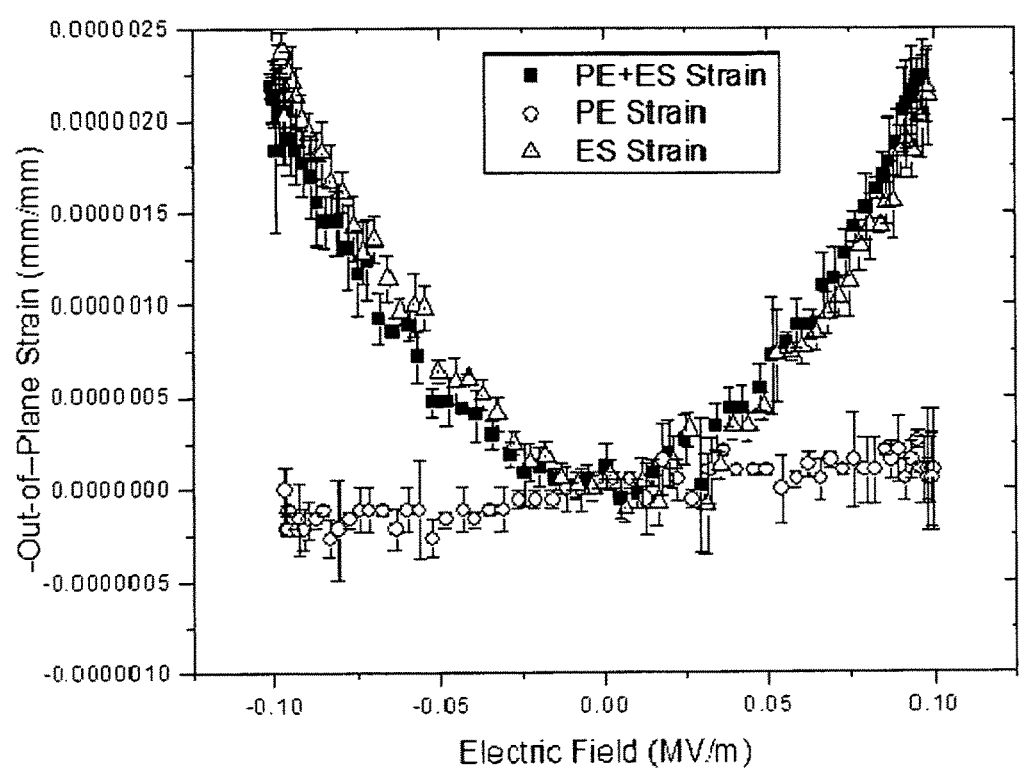
FIG. 3a shows the electroactive characteristic of a BN—BN composite.
Figure 3B:
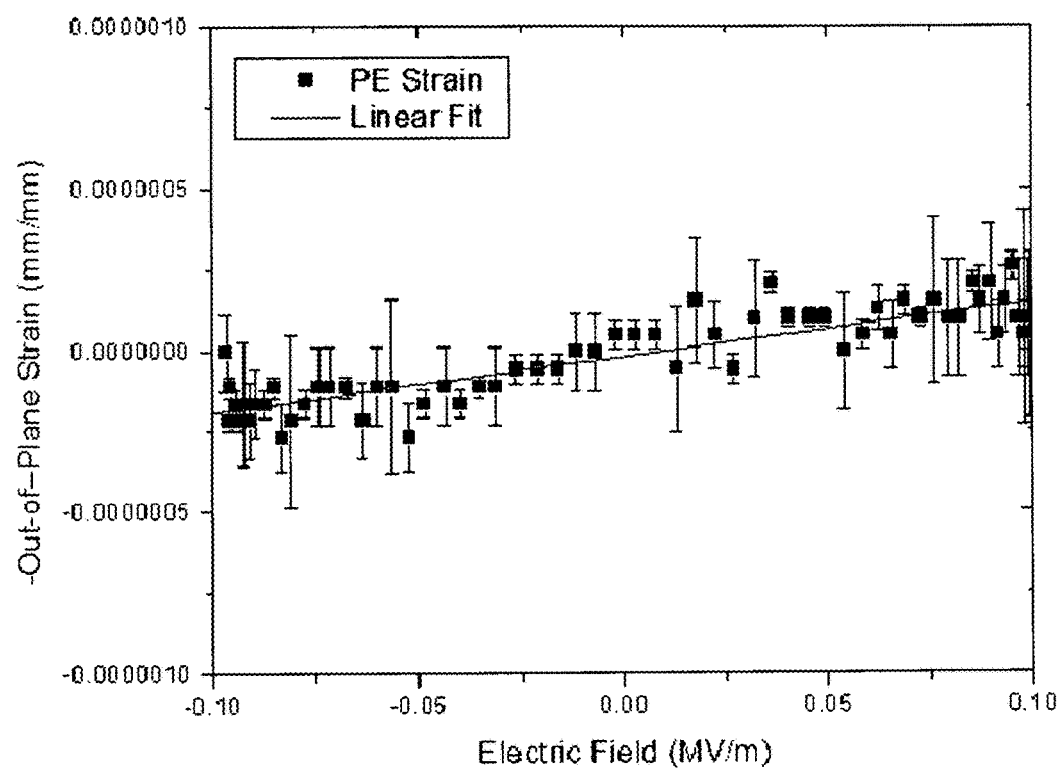
FIG. 3b shows the piezoelectric response of a BN—BN composite.
Figure 3C:
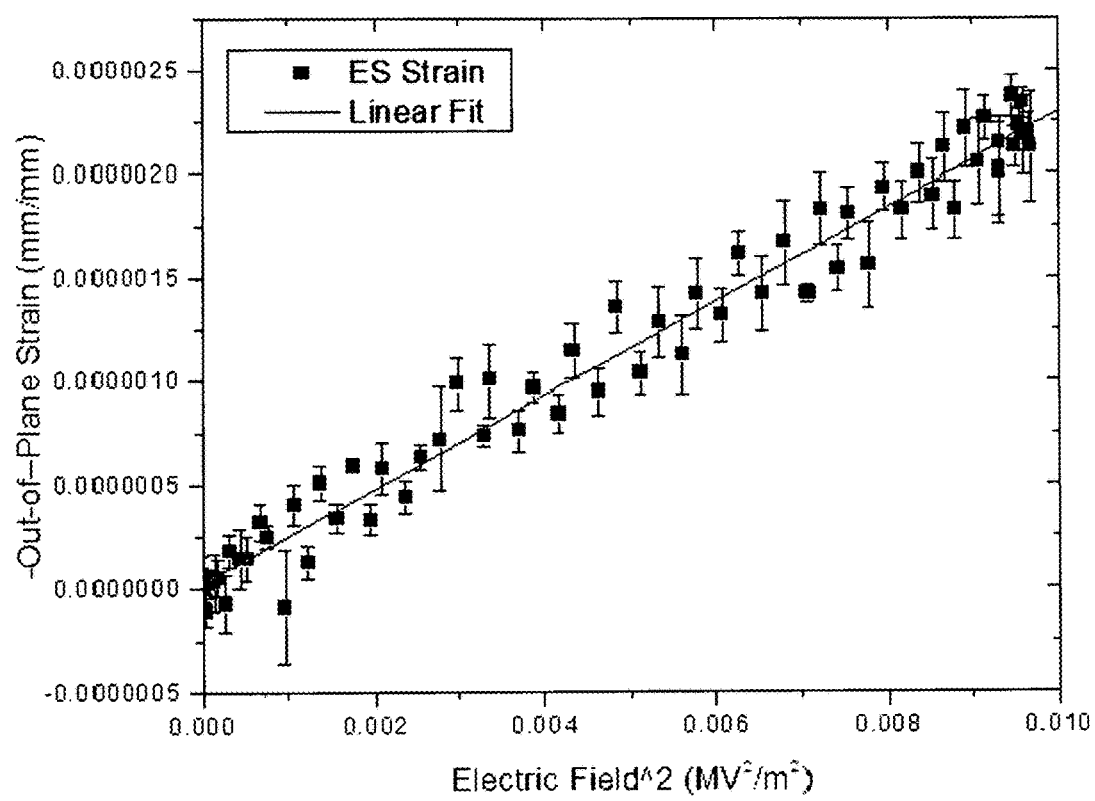
FIG. 3c shows the electrostrictive response of a BN—BN composite.

First, BN inorganic polymer precursors will be synthesized as shown in FIG. 1a. The precursor is mixed with BNNTs to prepare a homogeneous BNNT—BN composite solution. The BNNT—BN composite solution is then spun to make a fiber/fiber mat or to make a composite green body (FIG. 2a). The green bodies are pyrolyzed at elevated temperatures (>800° C.) under ammonia, inert gas or vacuum to facilitate transformation into BN ceramic nanocomposites. The morphology of the ceramic is controlled by adjusting the pyrolysis temperature, time and pressure. (FIG. 1b). To align the BNNTs for maximizing mechanical strength, piezoelectricity and thermal conductivity, the non-woven green bodies can be stretched (FIG. 2b). The BNNT—BN ceramic nanocomposite exhibits extreme hardness, similar to that of diamond, plus very high mechanical toughness and thermal stability, making it a superb candidate for anti-penetrator/wear resistance coatings. The piezoelectricity is synergized with the matrix BN structure. Electroactive properties, such as piezoelectricity and electro-optic properties, are affected by the crystalline structure of BN and the alignment of BNNTs. The prepared BNNT—BN composite exhibits excellent radiation protection properties due to its all boron-nitrogen structure. The prepared BN—BN composite can be used for an energy transducer or radiation shielding materials after coating with an appropriate passivation layer. FIGS. 3a and 3b is an example of the thermally stable electroactive property of the developed BN—BN composite after heat treatment at 1750° C. for 5 min under vacuum (about 10 Pa) and pressure of about 30 MPa. When an AC electric field of 1 Hz was applied, the strain ($S_{33}$) of the sample appears as a superposed curve (black solid squares in FIG. 3a) of linear and nonlinear strains as a function of frequency. The superposed curve was de-convoluted to a linear response (red open circles in FIGS. 3a and 3b) and a nonlinear response (blue open triangles in FIGS. 3a and 3b). The linear response seems to be originated from the piezoelectric property of the BNNTs. From linear fitting of the data (FIG. 3b), the piezoelectric coefficient, $d_{33}$ was calculated to be about −1.71 pm/V. The nonlinear response showed a quadratic increase with increasing applied electric field, indicating that the mechanism of this strain is mainly an electrostrictive response. The electrostrictive coefficient ($M_{33}$) of the BN—BN composite, calculated from the slope of a plot of the strain ($S_{33}$) to the square of electric field strength ($E^2$) (FIG. 3c), $S_{33}=M_{33} E^2$, was $-2.27\times10^{-16}$ $pm^2/V^2$ in average.

Figure 1C:
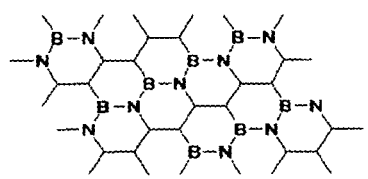
FIG. 1c shows schematic illustration of the conversion of the boron-nitride containing inorganic polymer precursor into a BCN ceramic.

By substituting other elements such as carbon or silicon, BCN or BCSiN, ceramics which have excellent hardness, tailored photonic bandgap, and photoluminescence can be designed and prepared (FIG. 1c). The effect of carbon substitution on electro-active properties will be studied with band gap characterization.

Obviously, many modifications may be made without departing from the basic spirit of the present invention. Accordingly, it will be appreciated by those skilled in the art that within the scope of the appended claims, the invention may be practiced other than has been specifically described herein. Many improvements, modifications, and additions will be apparent to the skilled artisan without departing from the spirit and scope of the present invention as described herein and defined in the following claims.

What is claimed is:

1. A method for forming boron nitride nanotube-boron nitride (BN—BN) nanocomposites, comprising:
   synthesizing a boron nitride containing ceramic precursor;
   combining a boron nitride nanotube solution with the boron nitride containing ceramic precursor to form a composite precursor;
   forming at least one green body from the composite precursor; and
   pyrolizing the at least one formed green body under an inert gas which is pressurized above 10 Pa and less than 1 kPa into BN—BN composite ceramics.

2. The method of claim 1 wherein the at least one green body is pyrolyzed at a temperature of at least 800° C.

3. The method of claim 1 wherein the at least one green body is pyrolyzed at a temperature of at least 1500° C.

4. The method of claim 1 wherein the at least one green body is of a form selected from the group consisting of fibers, woven mats, non-woven mats, films and plates.

5. The method of claim 1 wherein carbon is added to the boron nitride containing ceramic precursor.

6. The method of claim 1 wherein silicon is added to the boron nitride containing ceramic precursor.

7. The method of claim 1 wherein a combination of silicon and carbon is added to the boron nitride containing ceramic precursor.

8. The method of claim 1 wherein the concentration of boron nitride nanotube solution in the composite precursor is between 0.01 and 99.9% by weight.

9. The method of claim 1 wherein a combination of boron nitride, boron carbide, and silicon carbide are added to the boron nitride containing ceramic precursor.

10. A method for forming boron nitride nanotube-boron nitride (BN—BN) nanocomposites, comprising:
    synthesizing a boron nitride containing ceramic precursor;
    combining a boron nitride nanotube solution with the boron nitride containing ceramic precursor to form a composite precursor;
    forming at least one green body from the composite precursor; and
    pyrolizing the formed green body under ammonia which is pressurized above 10 Pa and less than 1 kPa into BN—BN composite ceramics.

11. The method of claim 10 wherein the at least one green body is pyrolized at a temperature of at least 800° C.

12. The method of claim 10 wherein the at least one green body is pyrolized at a temperature of at least 1500° C.

13. The method of claim 10 wherein the at least one green body is of a form selected from the group consisting of fibers, woven mats, non-woven mats, films and plates.

14. The method of claim 10 wherein carbon is added to the boron nitride containing ceramic precursor.

15. The method of claim 10 wherein silicon is added to the boron nitride containing ceramic precursor.

16. The method of claim 10 wherein a combination of silicon and carbon is added to the boron nitride containing ceramic precursor.

17. The method of claim 10 wherein the concentration of boron nitride nanotube solution in the composite precursor is between 0.01 and 99.9% by weight.

18. The method of claim 10 wherein a combination of boron nitride, boron carbide, and silicon carbide are added to the boron nitride containing ceramic precursor.

* * * * *